US006865100B2

(12) United States Patent
Wald et al.

(10) Patent No.: US 6,865,100 B2
(45) Date of Patent: Mar. 8, 2005

(54) 6F² ARCHITECTURE ROM EMBEDDED DRAM

(75) Inventors: Phillip G. Wald, Boise, ID (US); Casey Kurth, Eagle, ID (US); Scott Derner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 371 days.

(21) Appl. No.: 10/217,061

(22) Filed: Aug. 12, 2002

(65) Prior Publication Data

US 2004/0027848 A1 Feb. 12, 2004

(51) Int. Cl.⁷ .................................................. G11C 7/00
(52) U.S. Cl. ........................ 365/94; 365/103; 365/104; 365/185.08
(58) Field of Search ........................ 365/94, 103, 104, 365/185.08

(56) References Cited

U.S. PATENT DOCUMENTS

| | | | |
|---|---|---|---|
| 4,575,819 A | 3/1986 | Amin | |
| 4,855,803 A | 8/1989 | Azumai | |
| 5,053,648 A | 10/1991 | van den Elshout | |
| 5,148,391 A | 9/1992 | Zagar | |
| 5,270,241 A | 12/1993 | Dennison | |
| 5,351,213 A | 9/1994 | Nakashima | |
| 5,388,076 A | 2/1995 | Ihara | |
| 5,418,739 A | 5/1995 | Takasugi | |
| 5,526,302 A | 6/1996 | Takasugi | |
| 5,732,013 A | 3/1998 | Von Basse | |
| 5,757,690 A | 5/1998 | McMahon | |
| 5,831,892 A | 11/1998 | Thewes | |
| 5,900,008 A | 5/1999 | Akao | |
| 5,917,744 A | 6/1999 | Kirihata | |
| 5,959,912 A | * 9/1999 | Powell et al. | 365/201 |
| 5,961,653 A | 10/1999 | Kalter | |
| 5,966,315 A | 10/1999 | Muller | |
| 5,982,682 A | 11/1999 | Nevill | |
| 5,995,409 A | 11/1999 | Holland | |
| 6,134,137 A | * 10/2000 | Kurth et al. | 365/149 |
| 6,154,864 A | * 11/2000 | Merritt | 714/738 |
| 6,243,285 B1 | * 6/2001 | Kurth et al. | 365/149 |
| 6,266,272 B1 | 7/2001 | Kirihata | |
| 6,484,250 B1 | * 11/2002 | Mei et al. | 711/216 |
| 6,545,899 B1 | * 4/2003 | Derner et al. | 365/94 |
| 6,735,108 B2 | * 5/2004 | Kurth et al. | 365/149 |
| 6,747,889 B2 | * 6/2004 | Derner et al. | 365/94 |
| 6,781,867 B2 | * 8/2004 | Kurth et al. | 365/149 |
| 6,788,603 B2 | * 9/2004 | Derner et al. | 365/210 |

\* cited by examiner

*Primary Examiner*—Viet Q. Nguyen
(74) *Attorney, Agent, or Firm*—Leffert Jay & Polglaze, P.A.

(57) ABSTRACT

A read only memory (ROM) embedded dynamic random access memory (DRAM) has a 6F² architecture and uses isolation gates as hard shorting connections for ground or supply voltage connections to program ROM bits within the ROM embedded DRAM.

39 Claims, 9 Drawing Sheets

☐ = digitline contact
◯ = cell (capacitor)

Fig. 7

6F² ARCHITECTURE ROM EMBEDDED DRAM

The present invention relates generally to memory devices, and more specifically to a read only memory (ROM) embedded in a dynamic random access memory (DRAM) using a 6F² architecture.

BACKGROUND

Memory devices are typically provided as internal storage areas in the computer. There are several different types of memory. One type of memory is random access memory (RAM) that is typically used as main memory in a computer environment. Most RAM is volatile, which means that it requires a steady flow of electricity to maintain its contents.

A dynamic random access memory (DRAM) is made up of memory cells. Each cell of a modern DRAM includes a transistor and a capacitor, where the capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Figure 1:
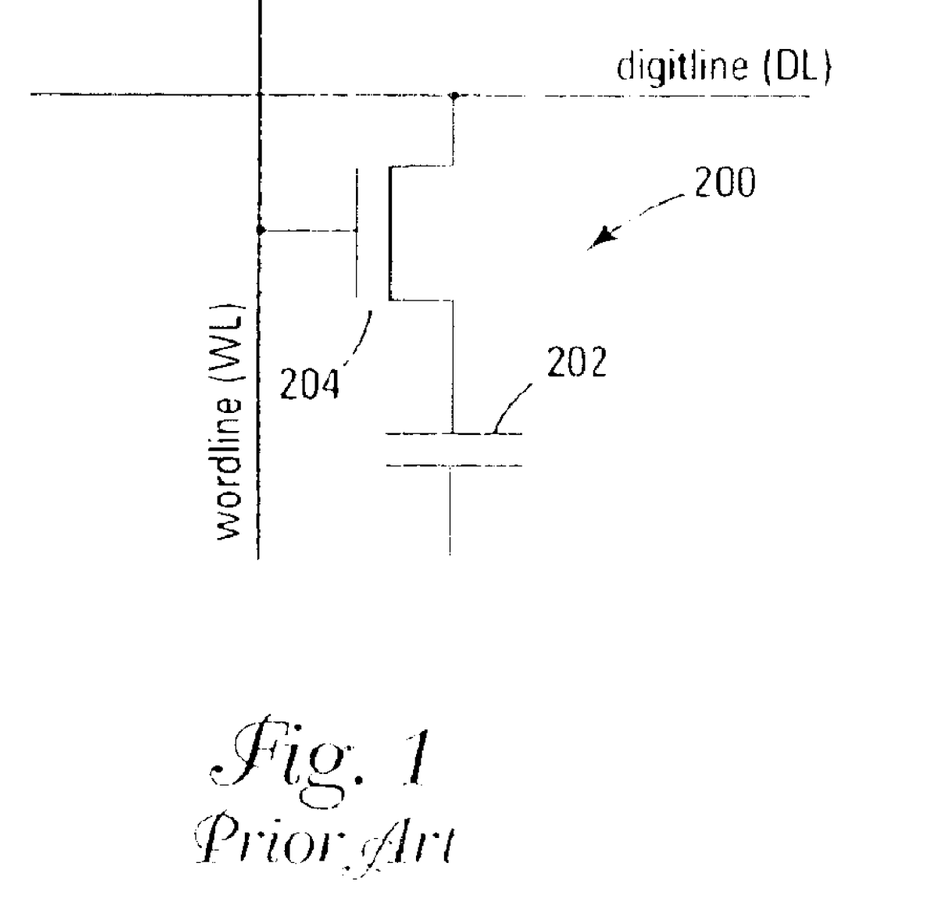
FIG. 1 is a diagram of a typical DRAM memory cell.

Referring to FIG. 1, a DRAM memory cell 200 is illustrated. The cell 200 is illustrated as having a capacitor 202 and an access transistor 204. The capacitor 202 is used to store a charge. The charge represents a bit of information. The access transistor 204 acts as a switch for the capacitor 202. That is, the access transistor 204 controls when a charge is placed on the capacitor 202, and when a charge is discharged from the capacitor 202. A word line is coupled to a control gate of the access transistor 204. When a cell is read, the word line activates the control gate of the transistor 204. Once this happens, any charge (or lack of charge) stored on the capacitor 202 is shared with a conductive digit line coupled to the drain of the access transistor 204. This charge is then detected in the digit line by a sense amplifier and then processed to determine the bit state of the cell 200. Tiling a selected quantity of cells together, such that the cells along a given digit line do not share a common word line and the cells along a common word line do not share a common digit line, forms a memory array. A typical memory array contains thousands or millions of cells.

Figure 2:
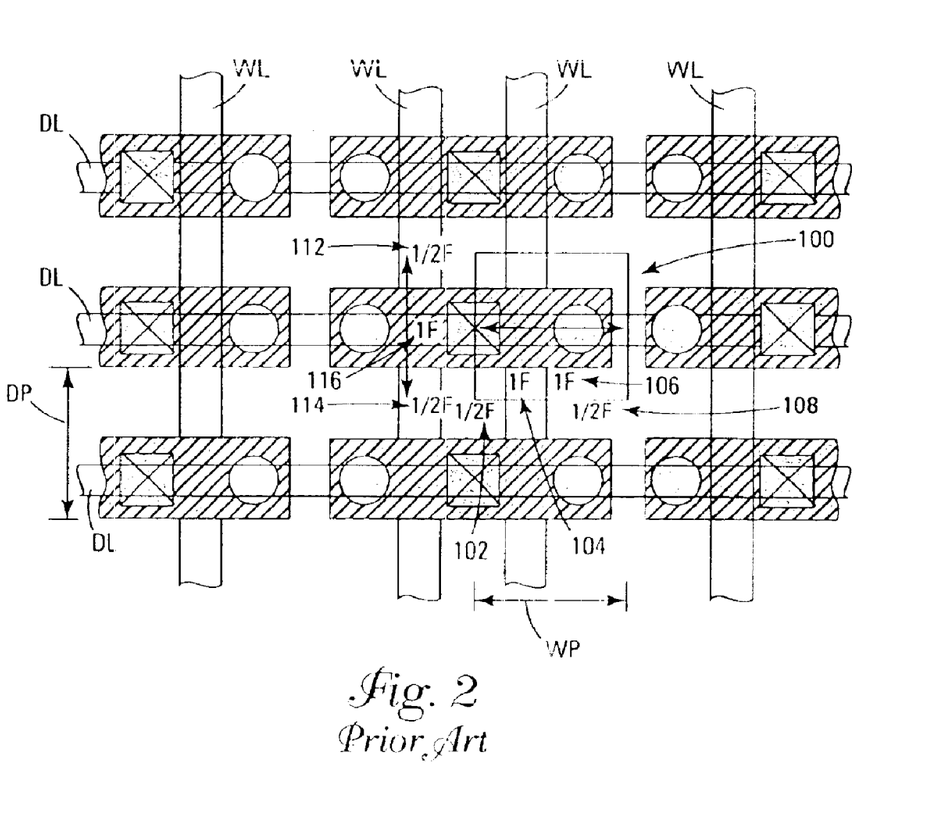
FIG. 2 is a diagram of a typical $6F^2$ architecture DRAM array.

A plan view of a portion of a DRAM memory array is illustrated in FIG. 2. In this example of a DRAM memory array layout, cells are paired to share a common contact to the digit line (DL), which reduces the array size by eliminating duplication. This layout is arranged in an open digit line architecture wherein each memory cell 100 has an area equal to 6F². That is, the area of a memory cell 100 in this layout is described as 6F². As illustrated in FIG. 2, a box is drawn around a memory cell 100 to show the cell's outer boundary. Along the horizontal axis of the memory cell 100, the box includes one-half digit line contact feature 102, one word line feature 104, one capacitor feature 106, and one-half field oxide feature 108 for a total of three features. Along the vertical axis of the memory cell 100, the box contains two one-half field oxide features 112, 114 and one active area feature 116 for a total of two features. Therefore, the total area of a cell 100 is 3F*2F=6F². Moreover, as FIG. 2 illustrates, pairs of cells in a row are isolated from other pairs of cells in the row. This is accomplished, in this example of an open digit line architecture, by grounding selective word lines (not shown). A discussion of DRAM circuit design including open digit line architecture is provided in Brent Keeth and Jacob Baker, DRAM Circuit Design, A Tutorial, 1–103 (IEEE Press 2001), which is incorporated herein by reference.

Figure 2A:
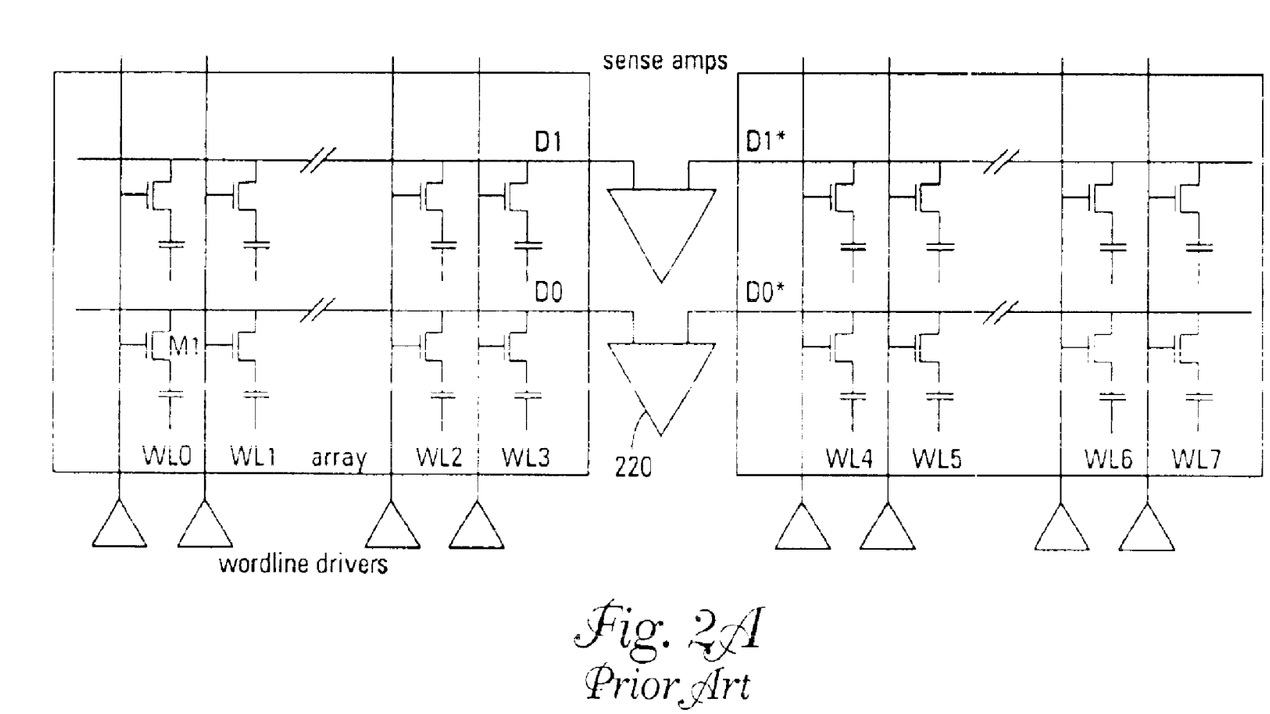
FIG. 2A is a diagram of a typical layout of an open digit line architecture DRAM.

Referring to FIG. 2A, a schematic diagram of a portion of an open digit line DRAM array is illustrated, wherein the cells have an area of 6F². As illustrated, sense amplifiers are coupled between digit line D1 and complementary digit line D1* and between D0 and complementary digit line D0*. Cells with a 1 bit can be expressed as having a +Vcc/2 stored on them and cells with a 0 bit can be expressed as having a −Vcc/2 stored on them. To read a memory cell, a digit line coupled to the cell and its complementary digit line are first initially equilibrated to Vcc/2 volts. Applying Vcc/2 bias voltage to the digit lines and then allowing the digit lines to float causes the digit lines to be equilibrated to Vcc/2 volts. Once the digit lines have been equilibrated to Vcc/2 volts, they remain in that state due to their capacitance. A voltage that is at least one transistor Vth above Vcc (this voltage is referred to as Vccp) is then applied to a word line coupled to the cell to be read. For example, if cell M1 is to be read, a voltage of Vccp is applied to word line WL0 after the digit lines D0 and D0* are equilibrated to Vcc/2. The charge on the capacitor of M1 is shared with digit line D0. In response to the shared charge, the voltage in digit line M1 either increases if cell M1 stored a 1 bit, or decreases if cell M1 stored a 0 bit. Thereafter, sense amplifier 220 compares the voltage in digit line D0 against the voltage in digit line D0*.

Figure 3:
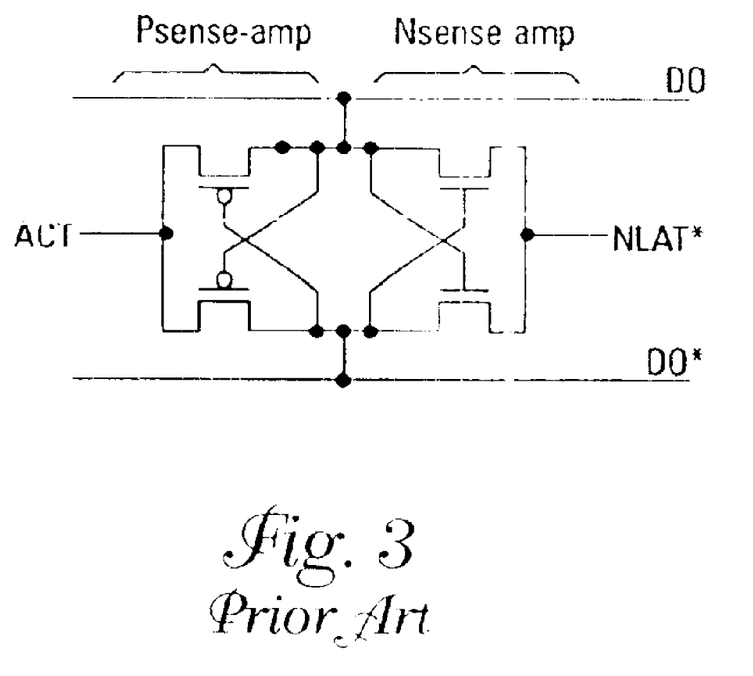
FIG. 3 is a circuit diagram of a sense amp configuration.

After the cell has been accessed, sensing occurs. Sensing is necessary to properly read the data and refresh the cells. A simplified illustration of a typical sense amplifier is shown in FIG. 3. As FIG. 3 illustrates, the sense amplifier includes a Psense-amp and a Nsense-amp. The Psense-amp includes a pMOS pair of transistors, and the Nsense-amp includes an nMOS pair of transistors. Also labeled in FIG. 3 is node ACT (for ACTive pull up) on the Psense-amp, and node NLAT* (Nsense-amp LATch) on the Nsense-amp. ACT and NLAT provide power and ground. Initially, NLAT* is biased to Vcc/2 and Act is biased to Vss or signal ground. Since, the digit line pair D0 and D0* are both at Vcc/2, the nMOS pair of transistors and the pMOS pair of transistors are turned off. When a cell is accessed that is coupled to either D0 or D0*, a voltage difference occurs between D0 and D0*. While one of the digit lines contains charge from the cell access, the other digit line serves as a reference for the sensing operation.

After the cell is accessed the sense amplifiers are generally fired sequentially, the Nsense-amp first, followed by the Psense-amp. The Nsense-amp is fired by pulling NLAT* toward ground. As the voltage difference between NLAT* and the digit lines approaches Vth, the nMOS transistor whose gate is connected to the higher voltage digit line begins to conduct. This conduction causes the low-voltage digit line to be discharged toward the NLAT* voltage. Ultimately, NLAT* will reach ground, and the digit line will be brought to ground potential. Sometime after the Nsense-amp fires, the Psense-amp is activated by bring the ACT toward Vcc. The Psense-amp operates in a complementary fashion to the Nsense-amp. With the low-voltage digit line approaching ground, there is a strong signal to drive the appropriate pMOS transistor into conduction. This conduction charges the high-voltage digit line toward ACT, ultimately reaching Vcc. The capacitor of the cell being read is refreshed during the sensing operation. This is accomplished by keeping the access transistor of the cell on when the Psense-amp is activated. The charge the capacitor of the cell had prior to accessing the cell is fully restored. That is, the charge will be restored to Vcc for a 1 bit and GND for a 0 bit.

What is needed is a ROM embedded DRAM utilizing a $6F^2$ architecture.

SUMMARY

In one embodiment, a method of making a ROM embedded DRAM includes generating a ROM bit mask for encoding ROM bits into a DRAM array, and hard wiring ROM bits of one polarity into predetermined cells of a $6F^2$ ROM embedded DRAM.

In another embodiment, a method of making a ROM embedded DRAM includes generating a ROM bit mask based on predetermined ROM encoding, and encoding a ROM section in a $6F^2$ architecture DRAM array. Encoding includes hard wiring ROM bits of a predetermined polarity to an adjacent isolation gate of the DRAM, wherein the isolation gate is tied to a predetermined potential representative of the predetermined polarity.

In yet another embodiment, a ROM embedded DRAM includes a $6F^2$ architecture DRAM array having DRAM cells separated by isolation gates, and at least first and second portions accessed by bit lines and by word lines. The first portion has a DRAM section and the second portion has a ROM section, each of the sections formed from DRAM cells The second portion has a first portion of the cells with hard wired shorts between DRAM cells and an adjacent isolation gate coupled to a predetermined potential The remaining portion of the cells are programmed to a complementary potential.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Figure 4:
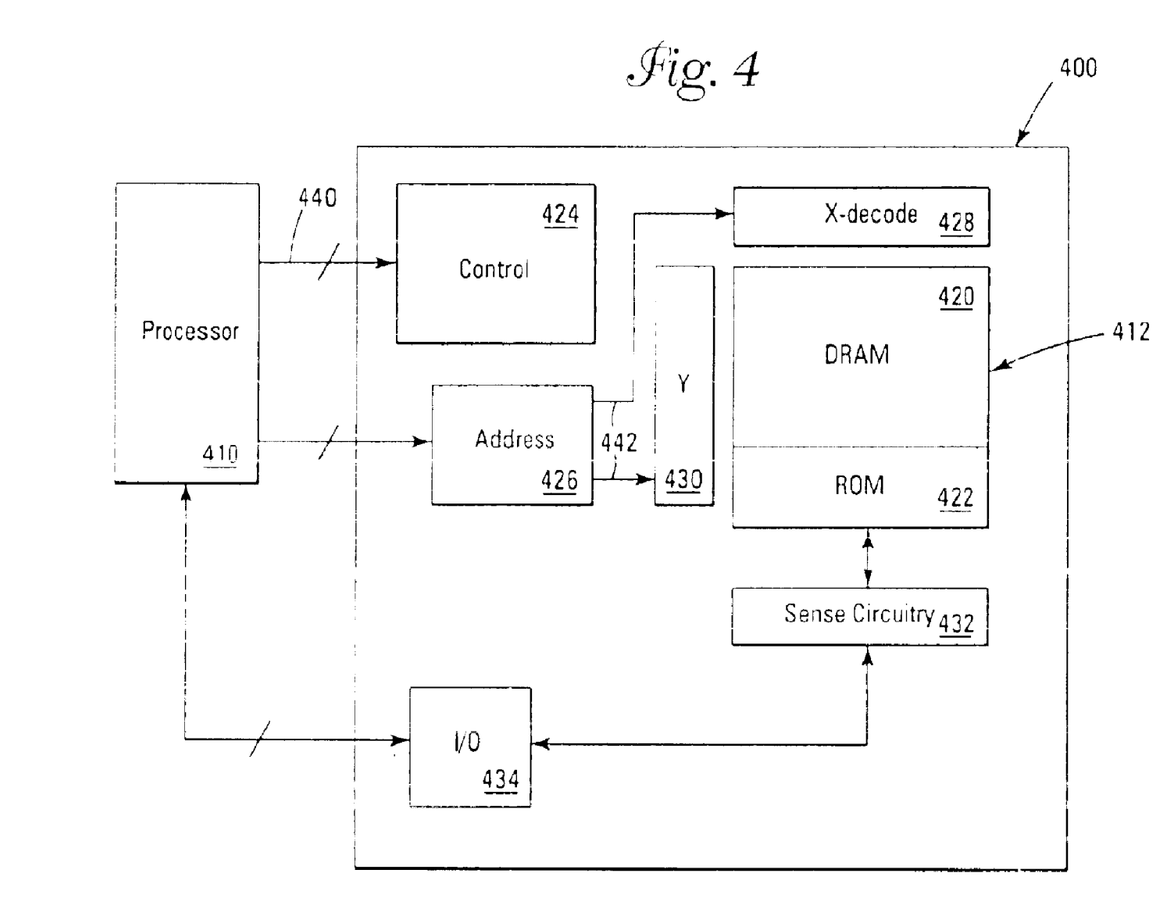
FIG. 4 is a block diagram of a ROM embedded DRAM on which embodiments of the present invention are practiced.

Referring to FIG. 4, a simplified block diagram of a ROM embedded DRAM 400 of the present invention is described. The memory device can be coupled to a processor 410 for bi-directional data communication. The memory includes an array of memory cells 412. The array includes a dynamic random access memory (DRAM) portion 420 and a read only memory (ROM) portion 422. The ROM array is "embedded" in the dynamic memory and may include some dynamic cells. Control circuitry 424 is provided to manage data storage and retrieval from the array in response to control signals 440 from the processor. Address circuitry 426, X-decoder 428 and Y-decoder 430 analyze address signals 442 and storage access locations of the array. Sense circuitry 432 is used to read data from the array and couple output data to I/O circuitry 434. The I/O circuitry operates in a bi-directional manner to receive data from processor 410 and pass this data to array 412. It is noted that the sense circuitry may not be used in some embodiments to store the input data.

Dynamic memories are well known, and those skilled in the art will appreciate that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow ROM embedded memory to be fabricated using known techniques. Further, it is desired to maintain operation of the memory in a manner that is externally transparent. As such, an external processor, or system, does not need special protocol to interface with the ROM embedded memory.

One technique for physically programming ROM embedded cells in an $8F^2$ architecture is described in U.S. Pat. No. 6,134,137 issued Oct. 17, 2000 entitled "ROM-Embedded-DRAM", incorporated herein by reference. U.S. Pat. No. 6,134,137 teaches that slight modifications in fabrication masks allow DRAM cells to be hard programmed to Vcc or Vss by shorting the cell to word lines. The memory reads the ROM cells in a manner that is identical to reading the DRAM cells. As described below, the present invention provides an improved ROM embedded DRAM.

Figure 5:
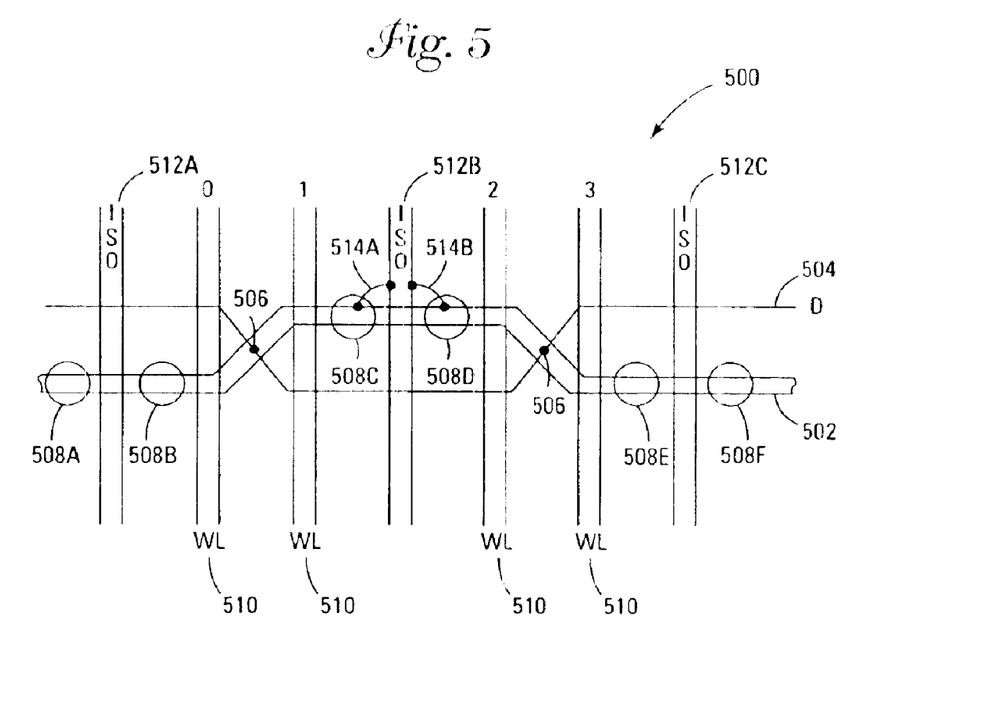
FIG. 5 is a schematic of a $6F^2$ ROM embedded DRAM according to one embodiment of the present invention.
Figure 6A:
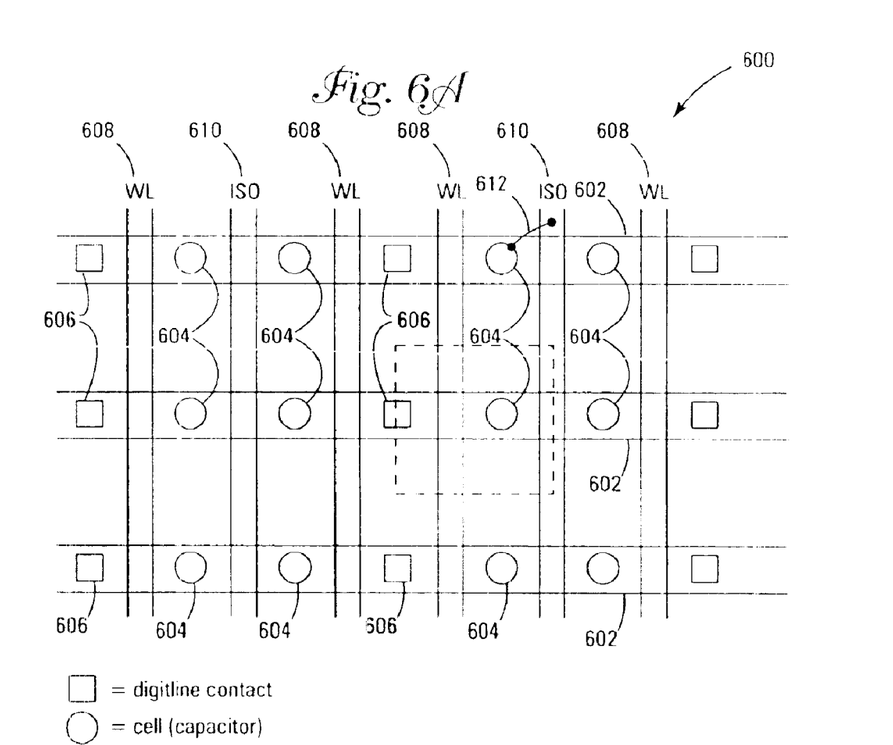
FIG. 6A is a schematic of a $6F^2$ ROM embedded DRAM according to another embodiment of the present invention.
Figure 6B:
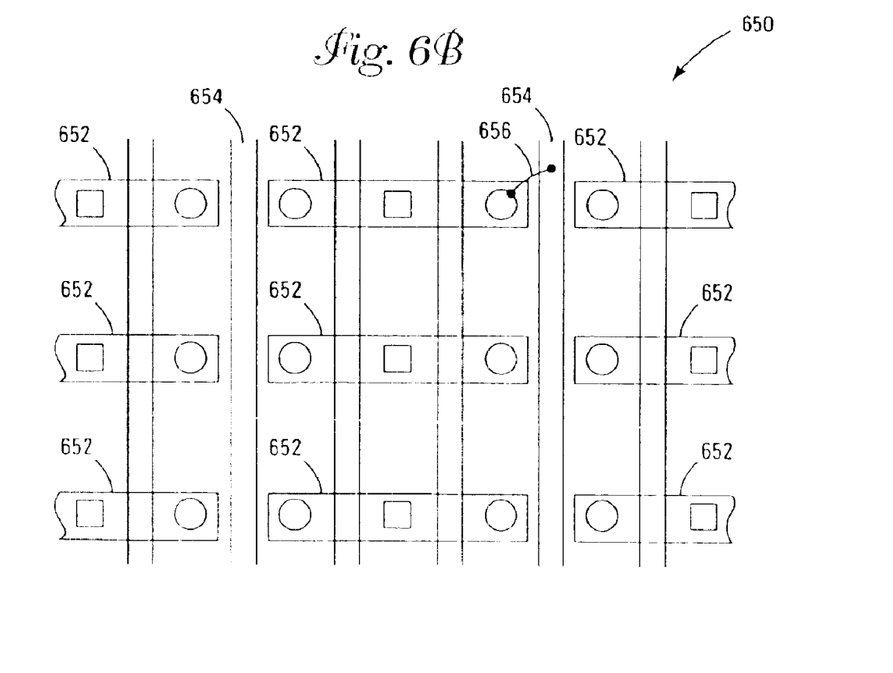
FIG. 6B is a schematic of a $6F^2$ ROM embedded DRAM according to yet another embodiment of the present invention.

A method of making a ROM embedded DRAM in an $8F^2$ architecture includes shorting a bit to an adjacent gate. In an $8F^2$ cell, however, the short to the adjacent gate may cause issues with the functionality of the ROM, such as too much capacitance due to multiple shorts to storage nodes. In a $6F^2$ architecture of the present invention, as shown in FIGS. 5, 6A, and 6B, an isolation gate appears between the cells for field isolation. The isolation gate is used as a ground node for the ROM. The isolation gate is potentially drawn larger than the other gates to provide a better short to the isolation gate.

In another embodiment, the active areas, such as active area 502, are broken up instead of continuous as shown in the Figures. When the active areas are broken up, the isolation gate is not necessary to isolate the adjacent cells from one another. However, in one embodiment, a gate is used and is positioned similarly to the isolation gate shown in the Figures. This gate is in various embodiments used as a potential node to tie cells to a certain potential. In various embodiments, the potential is ground, supply voltage VCC, or another voltage such as a negative voltage or a voltage in between a supply voltage and a ground voltage.

Active area strips in a $6F^2$ architecture stretch part or all the way across the memory array. Normal grounding of a cell to an adjacent word line has numerous potentially large problems as described above. In the present invention, a short is made instead from a cell to a ground connection, in this embodiment an isolation gate which is tied to ground. The $6F^2$ architecture uses transistors as isolation instead of oxide areas of shallow trench isolation as in an $8F^2$ architecture. The transistor of the isolation in the $6F^2$ architecture is always off in this embodiment, with its gate tied to ground. This eliminates or at least reduces the problems with excess capacitance in the $8F^2$ architecture or with adjacent word line shorting in the $6F^2$ architecture.

Figure 4A:
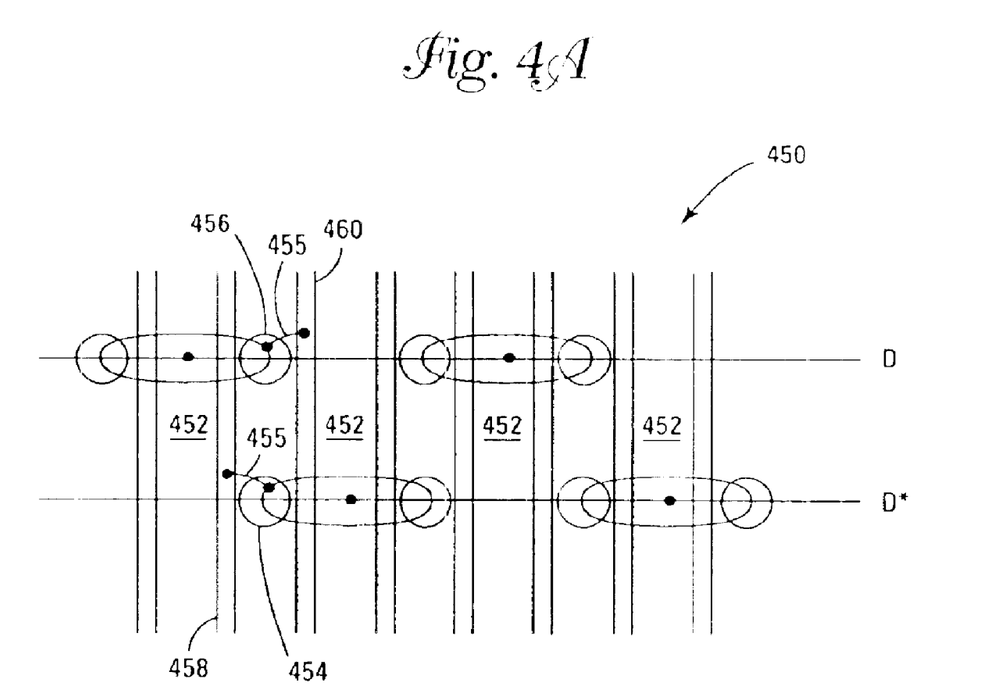
FIG. 4A is a diagram of a typical $8F^2$ architecture DRAM.

FIG. 4A shows a typical $8F^2$ architecture 450 of a DRAM. Such an architecture can also be utilized to make a ROM embedded DRAM. However, problems exist with the use of the $8F^2$ architecture for a ROM embedded DRAM as have been discussed above. An $8F^2$ architecture uses a shallow trench isolation area 452 between word lines and cells of the memory array as shown in FIG. 4A. Specifically, the ROM embedded DRAM in an $8F^2$ architecture shorts cells 454 and 456 to adjacent word lines 458 and 460 that are not normally used for accessing the particular cell, using short contacts 455. For example, in FIG. 4A, cell 454 is normally accessed by word line 460, and for shorting purposes to create a hard programmed ROM bit, the cell 454 is shorted with short contact 455 to word line 458. Word line 458 is grounded when word line 460 is fired, and cell 454 therefore reads as a short, hard wired to ground.

FIG. 5 illustrates a $6F^2$ architecture for a ROM embedded DRAM memory cell array 500 according to one embodiment of the present invention. An active area 502 of the array is interwoven with the digit lines 504 in a back and forth type pattern. Where the digit lines 504 cross the active area 502, a bit line contact 506 is formed. Memory cells 508A to 508F are shown in memory array 500, and are formed in contact with active areas. In the array 500, the $6F^2$ architecture includes an active area extending fully across the array. Word lines 510 run substantially orthogonal to the digit lines 504 and the active area 502, with each word line 510 accessing memory bit transistors on each digit line 504 as opposed to an $8F^2$ architecture. The cells 508 of the memory array 500 in the $6F^2$ architecture in the embodiment shown have multiple cells on the active area. A word line 510 is adjacent to each cell. However, where no word line or bit line contact is present between adjacent cells in the $6F^2$ architecture, an isolation gate 512 is placed adjacent each cell on the other side of the cell from its word line to reduce parasitic capacitance between word lines 510.

In the $6F^2$ architecture of the present invention, isolation gates 512 appear between the cells for field isolation. In one embodiment of the present invention, the short is made from a word line to a ground connection, in this embodiment an isolation gate which is tied to ground. In this embodiment, the tie to ground is the gate of an always off transistor normally used for isolation purposes between DRAM cells. The isolation gate transistor of this $6F^2$ architecture is always off when the part is used as a DRAM, with its gate tied to ground.

Each isolation gate 512 in this is embodiment coupled to ground. In this embodiment, instead of shorting a cell such as cells 508 to an adjacent word line, as in an $8F^2$ architecture, to make a ROM cell from a DRAM array cell, shorts 514A and 514B are made from cells to an adjacent isolation gate. For example, the storage plates of cells 508C and 508D are each hard shorted to isolation gate 512B in FIG. 5. This creates a direct short to ground on the isolation gate instead of on an unused word line. The advantages of such an embodiment are that this configuration places no capacitance on the word lines of the ROM section of the array. In this instance, the ROM region of the chip does not use the isolation transistor as an isolation device. This is because the cells and word lines in the ROM section of the chip do not need to have the same degree of isolation that DRAM cells used as DRAM need. Removing shorts from the DRAM cells to adjacent word lines decreases the load on word lines, and results in a decreased capacitance for the word lines.

Another problem addressed by the shorting to an adjacent isolation gate is that it is sometimes not possible to conduct enough current through a word line to make a cell a guaranteed short on the word line end. This can lead, in situations where such a connection is made, to problems with ROM reading, since it is possible that a "1" bit could be misinterpreted as a "0" bit.

The layout of the various embodiments of the present invention take advantage of the fact that ROM cells may be formed from the DRAM array. If it is not possible to conduct enough current through the word line to make the cell a guaranteed short on the word line end, then there could be problems with ROM reading, since it is possible that a "1" bit could be misinterpreted as a "0" bit.

A larger gate is used in one embodiment to guarantee enough conductor to allow a good connection for a short between a cell and the ground connection of the isolation gate. Further, whenever a short from a storage node to a word line is made, the process adds capacitance to the word line. Parasitic capacitance then becomes a problem because of capacitance on adjacent cell word lines.

In another embodiment, since the isolation gate is not needed for isolation purposes in a ROM use of the DRAM array, the isolation gate is tied to another voltage, such as $V_{cc}$.

FIGS. 6A and 6B show other $6F^2$ architecture ROM embedded DRAMs according to other embodiments of the present invention. FIG. 6A has multiple array cores and memory bits arranged in a plaid pattern. Active areas 602 extend the length of the array 600, and have thereon capacitors 604 and digit line contacts 606 for connection to digit lines. Word lines 608 are situated approximately orthogonal to the active areas and to the digit lines. There is a word line 608 adjacent each capacitor 604. Also adjacent each capacitor is an isolation gate. The isolation gates have been described in detail above. When the DRAM architecture of FIG. 6A is utilized as a ROM embedded DRAM, hard shorts are made to an isolation gate instead of to an adjacent word line. In this embodiment, a hard short 612 of a cell 604 is shown to an isolation gate 610.

FIG. 6B is another $6F^2$ architecture DRAM which is utilized as a ROM embedded DRAM 650. In this architecture, active areas 652 are not continuous across the array 650. Instead, the active areas 652 end at a capacitor 654, so that there is not an uninterrupted active area 652 between capacitors 652. In addition, isolation gates 654 are placed between capacitors where the active areas 652 have gaps. When it is desired to create a ROM cell in the ROM embedded DRAM 650, a short such as short 656 is made from a capacitor to an isolation gate. The short to the isolation gate has the same advantages in this architecture as it does in the architectures described above.

Figure 7:
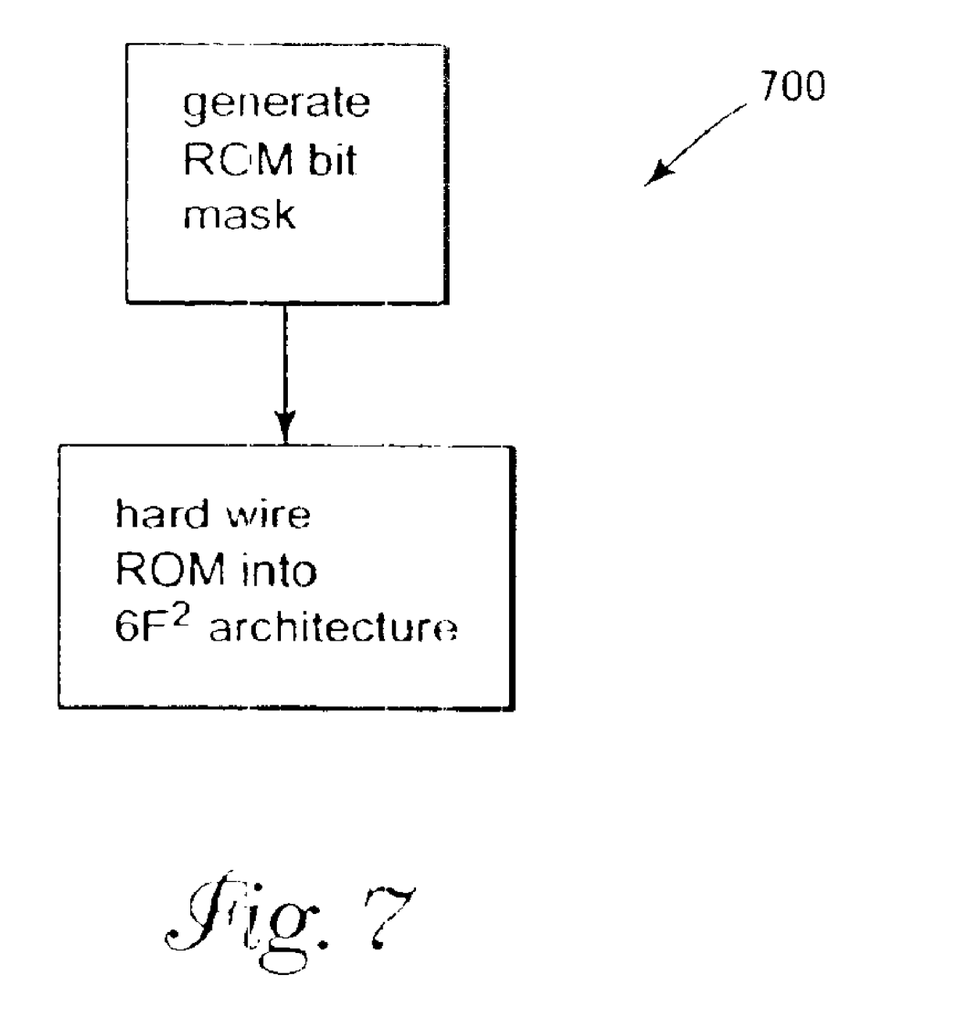
FIG. 7 is a flow chart diagram of a method according to one embodiment of the present invention.

A method 700 of making a ROM embedded DRAM using a $6F^2$ architecture is shown in FIG. 7. Method 700 comprises generating a ROM bit mask for encoding ROM bits into a DRAM array in block 702, and hard wiring the desired ROM bits into a $6F^2$ architecture DRAM array in block 704. Hard wiring the bits comprises in another embodiment shorting a cell to a gate adjacent the cell. The gate in various embodiments is tied to ground or to another voltage such as $V_{cc}$ or the like.

Although the various embodiments described have the gate shorted to ground, it should be understood that the gate in other embodiments is connected to a different potential, such as $V_{cc}$ or the like.

In another embodiment, the size of the gate is increased above a typical gate size to more adequately ensure that enough current may be conducted through the gate to sufficiently pull the shorted DRAM cells (now ROM cells) to the desired value. In this embodiment, the increased current capacity of the gate does not affect the remaining portions of the array, as it would if a different word line size were used.

The embodiments of the present invention reduce capacitance on word lines in an DRAM array modified to accommodate ROM cells.

Advantages include reduced capacitance on word lines since the short is made to the isolation gate instead of to a word line. Further advantage includes ability to make the isolation gate conductor large enough to carry sufficient current for a larger number of shorts than would be easily and without trouble accommodated on a word line. Reduction in capacitance on the word lines also increases the ability of the array to be read, since excess capacitance is a problem.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of making a ROM embedded DRAM comprising:
    generating a ROM bit mask for encoding ROM bits into a DRAM array; and
    hard wiring ROM bits of one polarity into predetermined cells of a $6F^2$ ROM embedded DRAM.

2. The method of claim 1, wherein hard wiring comprises:
    shorting a cell to be hard wired to an adjacent isolation gate.

3. The method of claim 1, wherein hard wiring comprises:
    shorting a cell to be hard wired to an adjacent gate; and
    providing a predetermined potential to the gate.

4. The method of claim 3, wherein the predetermined potential is a supply voltage.

5. The method of claim 3, wherein the predetermined potential is a ground voltage.

6. The method of claim 3, wherein the predetermined potential is a negative potential.

7. The method of claim 1, wherein the one polarity is ground.

8. The method of claim 1, and further comprising:
    programming the unprogrammed ROM bits in the DRAM array using DRAM programming techniques.

9. A method of making a ROM embedded DRAM, comprising:
    generating a ROM bit mask based on predetermined ROM encoding; and
    encoding a ROM section in a $6F^2$ architecture DRAM array, wherein encoding comprises hard wiring ROM bits of a predetermined polarity to an adjacent isolation gate of the DRAM, the isolation gate tied to a predetermined potential representative of the predetermined polarity.

10. The method of claim 9, wherein the predetermined polarity is logic 0.

11. The method of claim 9, and further comprising:
    programming remaining ROM bits to an opposite polarity.

12. A method of making a ROM embedded DRAM, comprising:
    generating a ROM bit mask based on predetermined ROM encoding; and
    encoding a ROM section in a $6F^2$ architecture DRAM array, wherein encoding comprises hard wiring ROM bits of a predetermined polarity to an adjacent gate of the DRAM, the gate tied to a predetermined potential representative of the predetermined polarity.

13. The method of claim 12, wherein the predetermined potential is a supply voltage.

14. The method of claim 12, wherein the predetermined potential is a ground voltage.

15. The method of claim 12, wherein the predetermined potential is a negative voltage.

16. A method of making a ROM embedded DRAM, comprising:
    fabricating a $6F^2$ architecture DRAM array having a ROM portion and a DRAM portion;

shorting DRAM cells in the ROM portion to one of a first polarity or a second polarity; and wherein shorting a cell comprises hard wiring the cell to a gate tied to the appropriate polarity for the ROM cell.

17. The method of claim 16, wherein the gate is tied to a supply voltage potential.

18. The method of claim 16, wherein the gate is tied to a ground voltage potential.

19. A ROM embedded DRAM, comprising:

a $6F^2$ architecture DRAM array having DRAM cells separated by isolation gates, and at least first and second portions accessed by bit lines and by word lines, the first portion comprising a DRAM section, and the second portion comprising a ROM section formed from DRAM cells; and the second portion having a plurality of hard wired shorts between predetermined DRAM cells and an adjacent isolation gate coupled to a predetermined potential, and wherein the remaining DRAM cells are programmed to a complementary potential.

20. The ROM embedded DRAM of claim 19, wherein active areas of the DRAM array are continuous through the array.

21. The ROM embedded DRAM of claim 19, wherein active areas of the DRAM array are discrete and separated by the isolation gates.

22. The ROM embedded DRAM of claim 19, wherein the predetermined potential is representative of a logic 0.

23. The ROM embedded DRAM of claim 19, wherein the $6F^2$ architecture is an open digit line array.

24. The ROM embedded DRAM of claim 19, wherein the $6F^2$ architecture comprises continuous active areas spanning an entire array.

25. The ROM embedded DRAM of claim 19, wherein the $6F^2$ architecture comprises discrete active areas spanning the array, the discrete active areas separated by the isolation gates.

26. A ROM embedded DRAM, comprising:

a $6F^2$ architecture DRAM array having DRAM cells separated by a broken portion of an active area, and at least first and second portions accessed by bit lines and by word lines, the first portion comprising a DRAM section, and the second portion comprising a ROM section formed from DRAM cells;

a plurality of gates, each gate between adjacent DRAM cells, each gate coupled to a predetermined potential; and the second portion having a plurality of hard wired shorts between predetermined ROM embedded DRAM cells and an adjacent gate, and wherein the remaining ROM embedded DRAM cells are programmed to a complementary potential.

27. A ROM embedded DRAM, comprising:

a DRAM memory array having a $6F^2$ architecture;

a first subarray of DRAM cells of the DRAM memory array configured as a ROM;

a second subarray of DRAM cells of the DRAM memory array configured as a DRAM;

the first subarray having ROM bits of a first logic value formed from the DRAM cells with hard shorts of a cell between the cell and an isolation gate connected to a first potential, and ROM bits of a second, complementary logic value programmed in a DRAM write operation.

28. The ROM embedded DRAM of claim 27, wherein the $6F^2$ architecture is an open digit line architecture.

29. The ROM embedded DRAM of claim 27, wherein the isolation gate is sized to accommodate a sufficient current to short a plurality of ROM cells to a predetermined potential.

30. A method of making a $6F^2$ architecture ROM embedded DRAM, comprising:

generating a ROM bit mask for encoding ROM bits of a first logic value into a DRAM array;

hard shorting the ROM bits of the first logic value to an isolation gate coupled to a predetermined potential; and programming ROM bits of a second, complementary logic value by DRAM write operation.

31. The method of claim 30, wherein the first logic value is logic 0.

32. A ROM embedded DRAM, comprising:

a $6F^2$ architecture DRAM array having DRAM cells separated by gates, and at least first and second portions accessed by bit lines and by word lines, the first portion comprising a DRAM section, and the second portion comprising a ROM section formed from DRAM cells; and the second portion having a plurality of hard wired shorts between predetermined DRAM cells and an adjacent gate coupled to a predetermined potential, and wherein the remaining DRAM cells are programmed to a complementary potential.

33. The ROM embedded DRAM of claim 32, wherein active areas of the DRAM array are continuous through the array.

34. The ROM embedded DRAM of claim 32, wherein active areas of the DRAM array are discrete.

35. The ROM embedded DRAM of claim 32, wherein the second portion comprises a plurality of hard wired shorts between predetermined DRAM cells and an adjacent gate whose predetermined potential represents a logic 0.

36. The ROM embedded DRAM of claim 32, wherein the second portion comprises a plurality of hard wired shorts between predetermined DRAM cells and an adjacent gate whose predetermined potential represents a logic 1.

37. The ROM embedded DRAM of claim 32, wherein the $6F^2$ architecture is an open digit line array.

38. The ROM embedded DRAM of claim 32, wherein the $6F^2$ architecture comprises continuous active areas spanning an entire array.

39. The ROM embedded DRAM of claim 32, wherein the $6F^2$ architecture comprises discrete active areas.

* * * * *